(12) United States Patent
Meusel et al.

(10) Patent No.: US 10,763,385 B2
(45) Date of Patent: Sep. 1, 2020

(54) SOLAR CELL DEVICE

(71) Applicant: AZUR SPACE Solar Power GmbH, Heilbronn (DE)

(72) Inventors: Matthias Meusel, Heilbronn (DE); Wolfgang Koestler, Heilbronn (DE); Daniel Fuhrmann, Heilbronn (DE); Thomas Lauermann, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 15/058,751

(22) Filed: Mar. 2, 2016

(65) Prior Publication Data
US 2016/0260860 A1 Sep. 8, 2016

(30) Foreign Application Priority Data

Mar. 2, 2015 (DE) .................. 10 2015 002 513

(51) Int. Cl.
*H01L 31/0725* (2012.01)
*H01L 31/0687* (2012.01)
(Continued)

(52) U.S. Cl.
CPC ........ *H01L 31/0725* (2013.01); *H01L 27/142* (2013.01); *H01L 31/028* (2013.01);
(Continued)

(58) Field of Classification Search
CPC ........... H01L 31/0687; H01L 31/06875; H01L 31/0725; H01L 31/076; H01L 31/0693;
(Continued)

(56) References Cited

U.S. PATENT DOCUMENTS 5,194,922 A * 3/1993 Moser ................. H01L 33/0008
257/12
6,300,558 B1 * 10/2001 Takamoto ........... H01L 31/0735
136/249
(Continued)

FOREIGN PATENT DOCUMENTS

DE 10 2004 023 856 A1 12/2005
DE 10 2004 055 225 A1 6/2006
(Continued)

OTHER PUBLICATIONS

Strobl, et al. "European roadmap of multijunction solar cells and qualification status." Photovoltaic Energy Conversion, Conference Record of the 2006 IEEE 4th World Conference on. vol. 2. IEEE, 2006.*
(Continued)

*Primary Examiner* — William E McClain
(74) *Attorney, Agent, or Firm* — Muncy, Geissler, Olds & Lowe, P.C.

(57) ABSTRACT

A device having a multi-junction solar cell and a protection diode structure, whereby the multi-junction solar cell and the protection diode structure have a common rear surface and front sides separated by a mesa trench. The common rear surface comprises an electrically conductive layer, and the light enters through the front side into the multi-junction solar cell. The cell includes a stack of a plurality of solar cells, and has a top cell, placed closest to the front side, and a bottom solar cell, placed closest to the rear side, and a tunnel diode is placed between adjacent solar cells. The number of semiconductor layers in the protection diode structure is smaller than the number of semiconductor layers in the multi-junction solar cell. The sequence of the semiconductor layers in the protection diode structure corre-
(Continued)

sponds to the sequence of semiconductor layers of the multi-junction solar cell.

19 Claims, 2 Drawing Sheets

(51) Int. Cl.
   *H01L 31/0224* (2006.01)
   *H01L 27/142* (2014.01)
   *H01L 31/0443* (2014.01)
   *H01L 31/028* (2006.01)
   *H01L 31/0304* (2006.01)

(52) U.S. Cl.
   CPC ........... *H01L 31/022425* (2013.01); *H01L 31/03046* (2013.01); *H01L 31/0443* (2014.12); *H01L 31/0687* (2013.01); *Y02E 10/544* (2013.01)

(58) Field of Classification Search
   CPC ............ H01L 31/0735; H01L 31/0443; H01L 31/022425
   See application file for complete search history.

(56) References Cited

U.S. PATENT DOCUMENTS

| | | | |
|---|---|---|---|
| 6,316,716 | B1 | 11/2001 | Hilgrath |
| 6,600,100 | B2 | 7/2003 | Ho et al. |
| 7,449,630 | B2 | 11/2008 | Ho et al. |
| 7,696,429 | B2 | 4/2010 | Strobl |
| 7,932,462 | B2 | 4/2011 | Van Riesen et al. |
| 8,604,330 | B1 | 12/2013 | Hennessy et al. |
| 8,704,085 | B2 | 4/2014 | Löckenhof |
| 9,337,360 | B1* | 5/2016 | Wiemer .......... H01L 31/022425 |
| 2002/0164834 | A1 | 11/2002 | Boutros et al. |
| 2004/0040593 | A1* | 3/2004 | Ho .................. H01L 31/046 136/255 |
| 2006/0048811 | A1* | 3/2006 | Krut .................. H01L 31/0687 136/249 |
| 2007/0256730 | A1 | 11/2007 | Strobl |
| 2008/0149173 | A1 | 6/2008 | Sharps |
| 2010/0326496 | A1* | 12/2010 | Bhattacharya .... H01L 31/03046 136/249 |
| 2011/0048516 | A1* | 3/2011 | Bedell .................. H01L 31/068 136/255 |

FOREIGN PATENT DOCUMENTS

| | | |
|---|---|---|
| DE | 10 2011 115 340 A1 | 4/2013 |
| DE | 100 56 214 A1 | 4/2013 |
| EP | 1 443 566 A1 | 8/2004 |
| EP | 1 008 188 B1 | 11/2009 |
| GB | 2 346 010 A | 7/2000 |
| JP | H 09-55522 A | 2/1997 |
| JP | S 63-95679 A | 7/2000 |
| JP | 2000-340823 A | 12/2000 |
| WO | WO 00/44052 A1 | 7/2000 |

OTHER PUBLICATIONS

Strobl, et al. "Development of lightweight space solar cells with 30% efficiency at end-of-life." Photovoltaic Specialist Conference (PVSC), 2014 IEEE 40th. IEEE, 2014.*
Strobl, et al. "Advanced GaInP/Ga (In) As/Ge Triple Junction Space Solar Cells." Photovoltaic Energy Conversion, 2003. Proceedings of 3rd World Conference on. vol. 1. IEEE, 2003.*
TJ Solar Cell 3G28C Data Sheet.*
TJ Solar Cell 3G30C Data Sheet.*
TJ Solar Cell Assembly 3030A Data Sheet.*
Wheeldon, et al. "Performance comparison of AlGaAs, GaAs and InGaP tunnel junctions for concentrated multijunction solar cells." Progress in Photovoltaics: Research and Applications 19.4 (2011): 442-452.*
Koo, et al. "GaInP/GaAs/Ge Triple Junction Solar Array Power Performance Evaluation on Geostationary Orbit." Journal of the Korean Society for Aeronautical & Space Sciences 42.12 (2014): 1057-1064.*
Caon, et al. "Multi-Junction GaAs Photovoltaic Assembly Technology for Very Severe LEO Environment Missions." 18th Space Photovoltaic Research and Technology Conference. 2003.*
Tseng, et al. "Improved performance mechanism of III-V compound triple-junction solar cell using hybrid electrode structure." Solar Energy 89 (2013): 17-22.*
Kalkur, et al. "Microstructure analysis of ohmic contacts to GaAs." Metallurgical Transactions A 21.9 (1990): 2459-24.*
Machine Translation of Koo reference.*
Kalkur, et al. "Non-alloyed ohmic contacts on rapid thermally Zn diffused GaAs." Solid-state electronics 32.4 (1989): 281-285.*
Kawanaka, et al. "Current-voltage characteristics of p-Ge/n-GaAs heterojunction diodes grown by molecular beam epitaxy." Journal of electronic materials 19.6 (1990): 575-580.*
Strobl et al., "Development and Qualification Status of European Triple Junction Solar Cells for Space Applications," Proc. of the 19th European Photovoltaic Solar Energy Conference, pp. 3614-3617 (Jun. 2004).
Strobl et al., "Evolution of Fully European Triple GaAs Solar Cell," Proc. 7th European Space Power Conference, pp. 1-6 (May 2005).

* cited by examiner

SOLAR CELL DEVICE

This nonprovisional application claims priority under 35 U.S.C. § 119(a) to German Patent Application No. 10 2015 002 513.9, which was filed in Germany on Mar. 2, 2015, and which is herein incorporated by reference.

BACKGROUND OF THE INVENTION

Field of the Invention

The invention relates to a solar cell device

Description of the Background Art

Various concepts for a solar cell device with a multi-junction solar cell and a protection diode structure are known from EP 1008 188 A1, U.S. Pat. No. 6,600,100 A2, EP 1 443 566 A1, and U.S. Pat. No. 7,449,630 A2. Further, other generic solar cell devices are known from DE 10 2004 055 225 A1, DE 10 2004 023 856 A1, and particularly from G. F. X. Strobl et al., Evolution of Fully European Triple GaAs Solar Cell, Proc. "Seventh European Space Power Conference," Stresa, Italy, 9-13 May 2005 (ESA SP-589, May 2005).

In particular, EP 1 008 188 A1 has on the top side of the solar cell stack only the known p+-doped AlGaAs window layer lying directly on the GaInP subcell, whereas metal on the n++-doped sublayer of the tunnel diode is formed directly on the protection structure.

SUMMARY OF THE INVENTION

It is therefore an object of the invention to provide a device that refines the prior art.

According to an embodiment of the invention, a solar cell device having a multi-junction solar cell and a protection diode structure is provided, whereby the multi-junction solar cell and the protection diode structure can have a common rear surface and front sides separated by a mesa trench, and the common rear surface comprises an electrically conductive layer, and the light enters through the front side into the multi-junction solar cell, and whereby the multi-junction solar cell comprises a stack of three or more solar cells, and has a top solar cell, placed closest to the front side, and a bottom solar cell, placed closest to the rear side, and each solar cell comprises an n-p junction, and a tunnel diode is placed between adjacent solar cells, and the number of semiconductor layers in the protection diode structure is smaller than the number of semiconductor layers in the multi-junction solar cell. The sequence of the semiconductor layers in the protection diode structure can correspond to the sequence of semiconductor layers of the multi-junction solar cell, whereby in the case of the protection diode structure, at least one top protection diode and a bottom protection diode, placed closest to the rear side, are formed and a tunnel diode can be placed between adjacent protection diodes, and the number of n-p junctions in the protection diode structure can be smaller at least by one than the number of n-p junctions of the multi-junction solar cell, a terminal contact structure, containing one or more metal layers, and an electrically conductive contact layer, below the terminal contact structure and having a plurality of semiconductor layers, are formed on the front side of the multi-junction solar cell and the protection diode structure, and the contact layer comprises a tunnel diode.

In an exemplary embodiment, the mesa trench can be completely formed between the layer stack of the protection diode structure and the stacked multi-junction solar cell, so that both stacks are completely separated at their top side and have a jointly formed cohesive layer only at the bottom side. It should also be noted that the multi-junction solar cell and the protection diode structure can be formed as n-p junctions; i.e., the n-layer is located above the p-layer, when viewed from the front side.

The layer stack of the protection diode structure on the front side can have the same or substantially the same terminal contact structure with particularly metal layers as the multi-junction solar cell, but several layers are etched away below the terminal contact structure on the protection diode structure in comparison with the multi-junction solar cell. As a result, the protection diode structure has fewer semiconductor layers. The solar cell device can also include a semiconductor wafer, for example, a germanium wafer. In general, the multi-junction solar cell occupies the largest part by far, preferably over 90% of the wafer surface, whereas the protection diode structure is arranged at one of the wafer corners. In a plan view of the wafer surface, both structures are arranged next to one another and are separated by the mesa trench.

The protection diode structure and the multi-junction solar cell can have layers of III-V semiconductor materials. In this case, the individual solar cells of the multi-junction solar cell have different band gaps, whereby the top solar cell, placed closest to the front side, has a higher band gap than a middle solar cell and the middle solar cell has a higher band gap than the bottom solar cell, placed closest to the rear side. As a result, the incidence of light always occurs through the top solar cell. The spectrum not absorbed by the top solar cell penetrates into the further solar cells. It should be pointed out that the solar cell stack and the protection structure are preferably monolithically integrated. In an alternative embodiment, the particular stack includes a semiconductor bonding surface. In an alternative embodiment, the solar cell stack has more than three solar cells. Preferably, the solar cell stack has four or five or six solar cells.

An advantage of the assembly is that with the formation of the metal contacts on a tunnel diode, for example, in the case of the protection diode structure, the reliability and long-term stability of the protection diode structure are increased. Further, no additional semiconductors or metal layers are applied to form the protection diode structure, but the semiconductors and the metal layers of the multi-junction cells are used for the front connection of the protection diode structure. In other words, the protection diode structure and the multi-junction cell have the same terminal contact structure. A characterization and qualification of two different contact systems are not necessary.

Tests have shown that a better yield or a more robust production process results with the formation of the tunnel diode. Further, the production process can be used flexibly; i.e., starting with the multi-junction solar cell, the protection diode structure can be produced with a few additional process steps with the use of the same terminal contact structure.

Other tests have shown that surprisingly with the introduction of an additional tunnel diode the voltage drop is influenced only insignificantly at higher current densities as well in the protection diode structure and particularly the through-connecting behavior of the protection diode structure does not change. It also became evident that the introduction of additional layers for forming the tunnel diode does not reduce but increases the yield.

In an embodiment, the electrically conductive layer on the rear side can comprise one or more metal layers and/or one or more semiconductor layers arranged on the metal layers. In particular when germanium substrate wafers are used, it is advantageous to provide a semiconductor layer of germanium; i.e., the mesa etching to form the mesa trench stops in the germanium substrate.

In an embodiment, a p-doped semiconductor layer can be formed between the terminal contact structure and the tunnel diode. Preferably, the p-doped semiconductor layer comprises a GaInP and/or GaAs compound, and the contact layer on the front side comprises one or more metal layers.

Tests have shown that it is advantageous, if the terminal contact structure comprises a layer of a AuZn alloy and/or a layer having an Ag compound and/or a layer having an Au compound and/or a layer having a Zn alloy. As a result, a low-impedance connection can be achieved particularly on a p-doped semiconductor layer. In other words, it is advantageous to form the metal layer with a bonded connection to the p-doped semiconductor layer.

In an embodiment, the tunnel diodes can be formed of at least one negatively doped and at least one positively doped layer, whereby the negative doping is realized by the elements Si and/or Te and/or Se and/or the positive doping is realized by the elements C and/or Zn and/or Mg. Preferably, the dopant concentration of the layers is greater than 1×10e18 cm-3, most preferably greater than 3×10e18 cm-3.

In an embodiment, a tunnel diode can be formed between the top solar cell and the terminal contact structure. The tunnel diode preferably has at least two layers, lying one above the other and having a GaAs compound, whereby at least one of the layers or both layers have an aluminum content between 1% and 40%. Most preferably the Al content in one of the layers or both layers is between 5% and 20%.

In an embodiment, the multi-junction solar cell can have a middle solar cell. The top solar cell can comprise GaInP and the middle solar cell GaAs or GaInAs and the bottom solar cell Ge.

In an embodiment, the multi-junction solar cell can comprise more than three solar cells. With an increasing number of solar cells with different band gaps, the band gaps of the particular solar cells can be matched more easily to one another and the efficiency of the assembly can be increased.

In an embodiment, the terminal contact structure of the protection diode directly adjoins a p-doped semiconductor layer at least partially or totally, whereby preferably the p-doped semiconductor layer has a GaInP and/or AlGaAs and/or GaAs and/or GaInAs compound. In an alternative embodiment, the terminal contact structure of the multi-junction solar cell directly adjoins a positively doped semiconductor layer at least partially or totally, whereby the semiconductor layer has a GaAs compound. Stated differently, the terminal contact structure forms a bonded connection with the p-doped semiconductor layer at least partially or totally.

In an embodiment, the terminal contact structure of the protection diode and the multi-junction solar cell can have an identical or substantially identical layer sequence. Both layer stacks can be grown, for example, epitaxially as mutually cohesive layers and the layers of the two stacks are separated by mesa etching only after the growing.

In an embodiment, the protection diode structure and the multi-junction solar cell can comprise a semiconductor mirror, whereby the layers of the semiconductor mirror have a doping greater than $1E17/cm^3$. The semiconductor mirror can have a lower electrical resistance bia the high doping. For example, the semiconductor mirror can be formed between two adjacent solar cells.

In an embodiment, the front side of the protection diode is not connected in an electrically conductive fashion to the rear side of the multi-junction solar cell. In contrast, the protection diode structure is connected to the multi-junction solar cell of another wafer; i.e., the protection structure of the particular wafer protects the solar cell structure of the next, preferably immediately adjacent wafer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
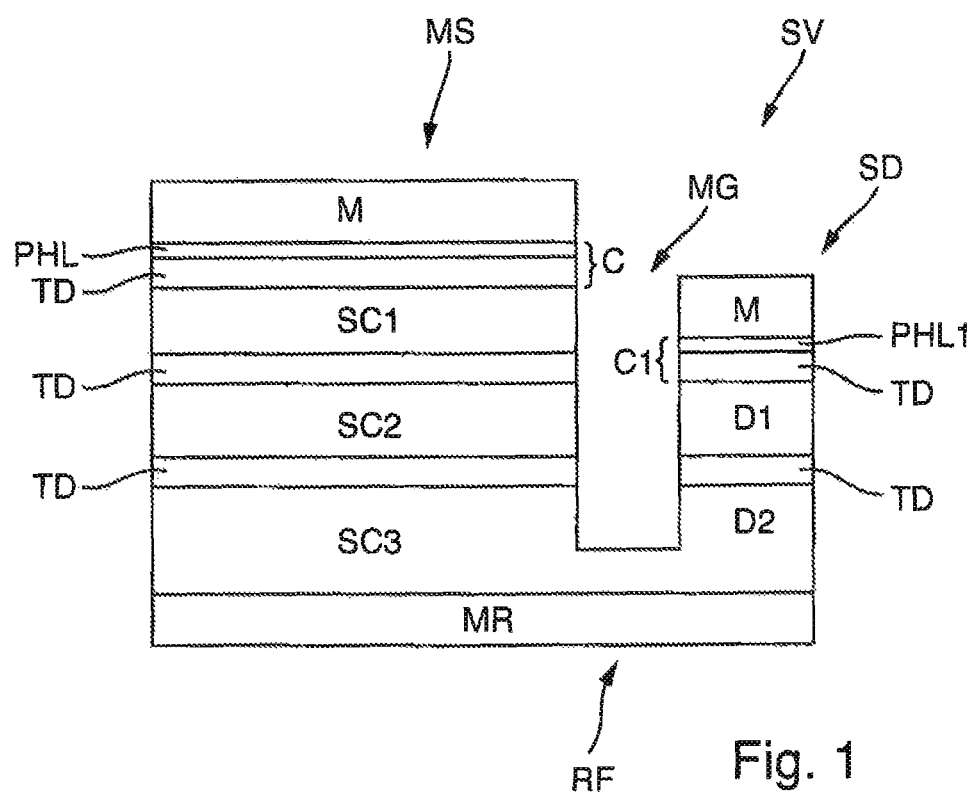
FIG. 1 shows a cross-sectional view of a first embodiment of the invention.

The illustration in FIG. 1 shows a cross-sectional view of a first embodiment of the invention of a solar cell device SV having a multi-junction solar cell MS and a protection diode structure SD, whereby multi-junction solar cell MS and protection diode structure SD have a common rear surface RF and front sides separated by a mesa trench MG. The common rear surface RF comprises an electrically conductive layer MR. Multi-junction solar cell MS comprises a stack made of a plurality of solar cells SC1, SC2, SC3 with a top solar cell SC1, placed closest to the front side, and a middle solar cell SC2 and a bottom solar cell SC3, placed closest to the rear side. Each solar cell SC1, SC2, SC3 comprises an n-p junction, which is not shown. A tunnel diode TD is placed in each case between adjacent solar cells SC1, SC2 and SC2, SC3.

In fact, the number of semiconductor layers in protection diode structure SD is smaller than the number of semiconductor layers in multi-junction solar cell MS, but the sequence of the remaining semiconductor layers in protection diode structure SD is identical to the sequence of semiconductor layers of multi-junction solar cell MS. Protection diode structure SD comprises a top protection diode D1 and a bottom protection diode D2 placed closest to the rear side. A tunnel diode TD is placed between the two protection diodes D1 and D2.

It is evident that the number of n-p junctions in protection diode structure SD is smaller by one than the number of n-p junctions of multi-junction solar cell MS.

A terminal contact structure M, made up of a plurality of metal layers (not shown), is formed on the front side of multi-junction solar cell MS and protection diode structure SD. An electrically conductive contact layer C, having a plurality of semiconductor layers, not shown in detail, is formed below terminal contact structure M in multi-junction solar cell MS. The plurality of semiconductor layers comprises a tunnel diode TD. A p-doped semiconductor layer PHL is formed as part of contact layer C between terminal contact structure M and tunnel diode TD.

An electrically conductive contact layer C1, having a plurality of semiconductor layers, not shown in detail, is formed below terminal contact structure M in protection diode structure SD. The plurality of semiconductor layers comprises a tunnel diode TD. A p-doped semiconductor layer PHL1 is formed as part of contact layer C1 between terminal contact structure M and tunnel diode TD.

Figure 2:
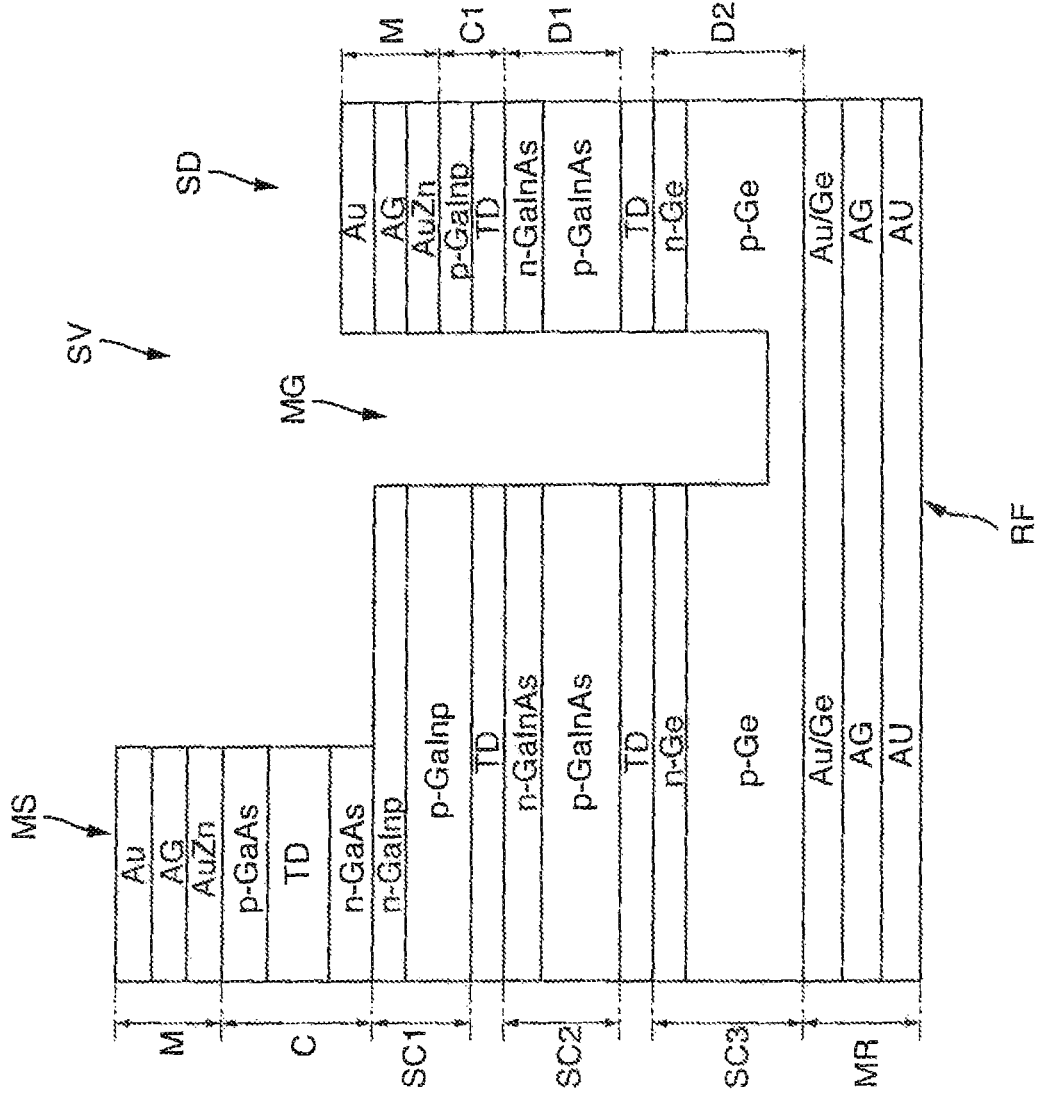
FIG. 2 shows a detailed embodiment of the cross-sectional view shown in FIG. 1.

A detailed embodiment of the cross-sectional view, illustrated in FIG. 1, is shown in the illustration in FIG. 2. Only the differences from the illustration in FIG. 1 will be explained below.

Terminal contact structure M has an overlying gold layer and an underlying layer of silver and a layer of a AuZn alloy under the silver layer. The p-doped semiconductor layer PHL, having a GaAs compound, is formed under the AuZn layer in multi-junction solar cell MS and the p-doped semiconductor layer PHL1, having a p-GaInP compound, is formed in protection diode structure SD. An n-doped GaAs layer, which is part of contact layer C, lies below tunnel diode TD in multi-junction solar cell MS, whereas in protection diode structure SD the underlying n-doped n-GaInAs layer is part of the top protection diode, i.e., no longer included in contact layer C1.

Below contact layer C, solar cell stack MS has top solar cell SC1 with an n-doped GaInP emitter layer and a p-doped GaInP base layer. Below the TD, middle solar cell SC2 has an n-doped InGaAs emitter layer and a p-doped InGaAs base layer. Below the TD, bottom solar cell SC3 has an n-doped Ge emitter layer and a p-doped Ge base layer.

Below contact layer C1, protection diode structure SD below tunnel diode TD has the top protection diode D1 with an n-doped InGaAs layer and a p-doped InGaAs layer. Below the TD, bottom protection diode D2 has an n-doped Ge layer and a p-doped Ge layer. The p-doped Ge base layer represents a layer common to solar cell stack MS and protection diode structure SD.

A gold-germanium layer AU/GE is formed below the p-doped Ge base layer for the rear terminal contact MR. A AG layer is formed below the gold-germanium layer AU/GE and a AU layer below the AG layer.

It should be noted that the embodiment can also be applied to an n-fold solar cell SCn (not shown). In this case, n is a natural number greater than three. The number N of protection diodes D1, D2, DN is smaller at least by one than the number of the solar cells n; i.e., N=n−1 applies to the diode number.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar cell device comprising:
a multi-junction solar cell; and
a protection diode structure,
wherein the multi-junction solar cell and the protection diode structure have a common rear surface and the multi-junction solar cell and the protection diode structure each having front sides separated by a mesa trench,
wherein the common rear surface comprises an electrically conductive layer extending along a full length of the common rear surface under the multi-junction solar cell and the protection diode structure, and light enters through the front side of the multi-junction solar cell,
wherein, the multi-junction solar cell comprises a stack of at least three solar cells including a top solar cell placed closest to the front side of the multi-junction solar cell and a bottom solar cell placed closest to the common rear surface, and each of the at least three solar cells comprises an n-p junction, and a solar cell tunnel diode is placed between adjacent solar cells,
wherein a number of semiconductor layers in the protection diode structure is smaller than a number of semiconductor layers in the multi-junction solar cell, the multi-junction solar cell including additional semiconductor layers,
wherein a sequence of the semiconductor layers in the protection diode structure is identical to a sequence of remaining semiconductor layers of the multi-junction solar cell without the additional semiconductor layers,
wherein at least one top protection diode adjacent to the front side of the protection diode structure and a bottom protection diode placed closest to the common rear surface are provided and a protection diode tunnel diode is placed between adjacent protection diodes,
wherein the protection diode structure comprises at least two n-p junctions,
wherein a number of the n-p junctions in the protection diode structure is smaller at least by one than a number of the n-p junctions of the multi-junction solar cell,
wherein a protection diode terminal contact structure containing one or more metal layers is formed on the front side of the protection diode structure and a first electrically conductive contact layer is formed directly below the protection diode terminal contact structure, the first electrically conductive contact layer having a plurality of contact layer semiconductor layers including a first additional tunnel diode, and
wherein a solar cell terminal contact structure containing one or more metal layers is formed on the front side of the multi-junction solar cell and a second electrically conductive contact layer is formed directly below the solar cell terminal contact structure, the second electrically conductive contact layer having a plurality of contact layer semiconductor layers including a second additional tunnel diode, and,
wherein the electrically conductive layer is a rear terminal contact disposed along the common rear surface beneath the multi-junction solar cell and the protection diode structure, the rear terminal contact comprising a top layer of Au and Ge, a bottom layer of Au, and a layer of Ag disposed between the top layer and the bottom layer.

2. The solar cell device according to claim 1, wherein a p-doped semiconductor layer is formed as part of the contact layer of the multi-junction solar cell between the solar cell terminal contact structure and the second additional tunnel diode.

3. The solar cell device according to claim 2, wherein the p-doped semiconductor layer comprises a GaInP and/or GaAs compound.

4. The solar cell device according to claim 1, wherein the solar cell terminal contact structure comprises a layer of a AuZn alloy and/or a layer of a Ag compound and/or a layer of a Au compound and/or a layer of a Zn alloy.

5. The solar cell device according to claim 1, wherein the solar cell tunnel diodes, the protection diode tunnel diodes, and the first and second additional tunnel diodes are formed of at least one negatively doped and one positively doped layer, wherein the negative doping is realized by the element Si and/or Te and/or Se and/or the positive doping realized is by the elements C and/or Zn and/or Mg and the dopant concentration of the layers is greater than $1 \times 10^{18}$ cm$^{-3}$.

6. The solar cell device according to claim 1, wherein the multi-junction solar cell has a middle solar cell and the top solar cell comprises GaInP and the middle solar cell comprises GaAs or GaInAs and the bottom solar cell comprises Ge.

7. The solar cell device according to claim 1, wherein the multi-junction solar cell comprises more than three solar cells.

8. The solar cell device according to claim 1, wherein the protection diode terminal contact structure directly adjoins a positively doped semiconductor layer at least partially, wherein the positively doped semiconductor layer has a GaInP compound and/or AlGaAs compound and/or wherein the solar cell terminal contact structure of the multi-junction solar cell directly adjoins a positively doped semiconductor layer at least partially, and wherein the positively doped semiconductor layer has a GaAs compound.

9. The solar cell device according to claim 1, wherein the protection diode terminal contact structure and the solar cell terminal contact structure have an identical layer sequence.

10. The solar cell device according to claim 1, wherein the protection diode structure and the multi-junction solar cell comprise a semiconductor mirror, and wherein the layers of the semiconductor mirror have a doping greater than $1E17/cm^3$.

11. The solar cell device according to claim 1, wherein the front side of the protection diode is not connected in an electrically conductive manner to the common rear surface of the multi-junction solar cell.

12. The solar cell device according to claim 1, wherein the bottom solar cell of the multi-junction solar cell and the bottom protection diode of the protection diode structure share at least one layer not separated by the mesa trench.

13. The solar cell device according to claim 1, wherein the first additional tunnel diode of the protection diode structure and the second additional diode of the multi-junction solar cell are separated by the mesa trench.

14. The solar cell device according to claim 1, wherein the first additional tunnel diode of the protection diode structure is provided in a first plane and the second additional diode of the multi-junction solar cell is provided in a second plane, the first plane being disposed closer to the common rear surface than the second plane.

15. The solar cell device according to claim 1, wherein the solar cell terminal contact structure comprises a layer of a AuZn alloy, a layer Ag and a layer of Au.

16. The solar cell device according to claim 1, wherein each of the at least three solar cells consists of an n-p junction and a solar cell tunnel diode placed directly between adjacent solar cells.

17. The solar cell device according to claim 1, wherein the solar cell terminal contact structure comprises a bottom layer of a AuZn alloy, a middle layer of Ag compound and a top layer of Au.

18. A solar cell device, comprising:
  a multi-junction solar cell comprising:
    a first solar cell, a second solar cell, and a third solar cell, the first solar cell being disposed on a shared metal contact layer, the second solar cell being adjacent to the first solar cell and separated from the first solar cell by a first solar cell tunnel junction, the third solar cell being adjacent to the second solar cell and separated from the second solar cell by a second solar cell tunnel junction;
    a first additional tunnel junction disposed on the third solar cell; and
    a solar cell terminal contact structure disposed on the first additional tunnel junction;
  a protection diode structure, comprising:
    a first protection diode and a second protection diode, the first protection diode being disposed on the shared metal contact layer and the second protection diode being adjacent to the first protection diode and separated by a protection diode tunnel junction;
    a second additional tunnel junction disposed on the second protection diode; and
    a protection diode terminal contact structure disposed on the second additional tunnel junction; and
  a mesa trench separating at least the third solar cell and the second protection diode in a lateral direction, the shared metal contact layer extending beneath the mesa trench,
  wherein a first sequence of first semiconductor layers of at least the first solar cell, the first solar cell tunnel junction, and the second solar cell are substantially identical to a second sequence of second semiconductor layers of the first protection diode, the first protection diode tunnel junction, and the second protection diode,
  wherein the protection diode structure comprises at least one less diode than the multi-junction solar cell,
  wherein the shared metal contact layer extends under the multi-junction solar cell, the mesa trench, and the protection diode structure,
  wherein the shared metal contact comprises a top layer of Au and Ge, a bottom layer of Au, and a layer of Ag disposed between the top layer and the bottom layer.

19. The solar cell device according to claim 18, wherein the solar cell terminal contact structure comprises a bottom layer of a AuZn alloy, a middle layer of Ag compound and a top layer of Au.

* * * * *